United States Patent
Vandemeer et al.

(10) Patent No.: US 7,000,473 B2
(45) Date of Patent: Feb. 21, 2006

(54) MEM STRUCTURE HAVING REDUCED SPRING STICTION

(75) Inventors: Jan E. Vandemeer, Mesa, AZ (US); Bishnu P. Gogoi, Scottsdale, AZ (US); Jonathan H. Hammond, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 107 days.

(21) Appl. No.: 10/828,042

(22) Filed: Apr. 20, 2004

(65) Prior Publication Data
US 2005/0229706 A1   Oct. 20, 2005

(51) Int. Cl.
*G01P 15/125* (2006.01)
(52) U.S. Cl. ............................. 73/514.32; 73/514.38
(58) Field of Classification Search ........... 73/514.32, 73/514.38; 361/280
See application file for complete search history.

(56) References Cited

U.S. PATENT DOCUMENTS

| | | |
|---|---|---|
| 5,181,156 A | 1/1993 | Gutteridge et al. |
| 5,542,295 A | 8/1996 | Howe et al. |
| 5,772,902 A | 6/1998 | Reed et al. |
| 6,065,341 A * | 5/2000 | Ishio et al. ............. 73/514.32 |
| 6,105,428 A * | 8/2000 | Schmiesing et al. ...... 73/514.32 |
| 6,229,684 B1 * | 5/2001 | Cowen et al. ............ 361/278 |
| 6,621,392 B1 | 9/2003 | Volant et al. |

OTHER PUBLICATIONS

Kionix Webpage (http://www.kionix.com); Description of Kionix Accelerometer; 2 pgs; [online] [retrieved on Mar. 11, 2004].

* cited by examiner

*Primary Examiner*—John E. Chapman
(74) *Attorney, Agent, or Firm*—Robert L. King; David G. Dolezal

(57) ABSTRACT

A micro-electromechanical (MEM) device has a folded tether spring in which each fold of the spring is surrounded by a rigidly fixed inner structure and outer structure. The fixed inner structure increases restoring force of the spring. The rigidly fixed inner and outer structures each have a major surface that include a plurality of notches of fixed width relative to a distance between the major surface and the spring. Additionally in one form extensions from the major surface of the rigidly fixed inner and outer structures are provided at distal ends thereof to make initial contact with the spring. The notches of the MEM device both reduce surface area contact with the spring and wick moisture away from the spring to minimize stiction.

24 Claims, 2 Drawing Sheets

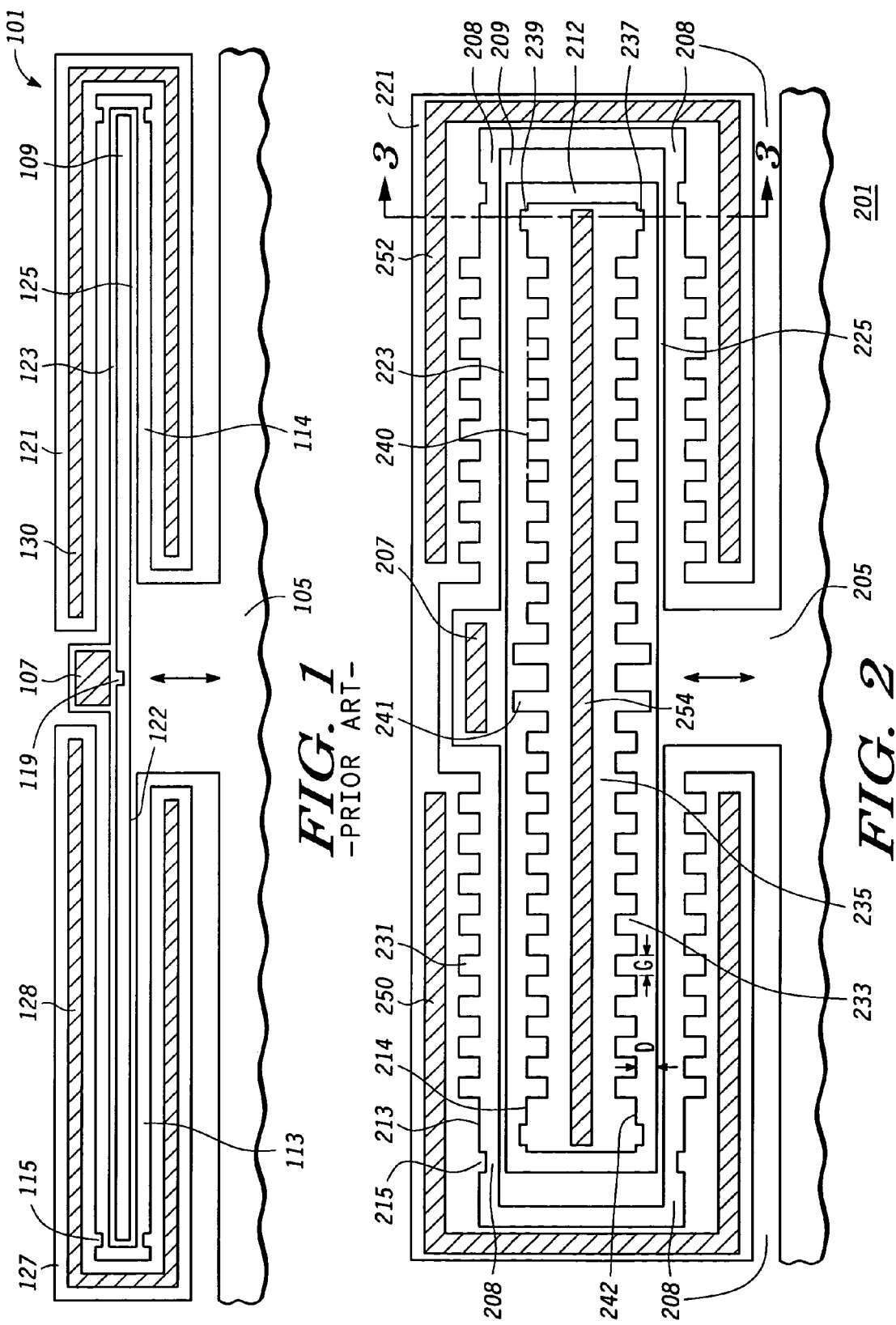

MEM STRUCTURE HAVING REDUCED SPRING STICTION

FIELD OF THE INVENTION

The present invention relates generally to MEM structures, and more specifically, to semiconductor accelerometer devices.

RELATED ART

Micro-electromechanical (MEM) devices are commonly used in many industrial applications including accelerometers used in motorized vehicles. A significant problem associated with MEM devices is that moving parts therein tend to stick to one another upon physical contact. This problem is commonly referred to as "stiction" and is caused by the attraction at an atomic level between two surfaces. Stiction can occur after processing is complete and can be due to electrostatic attraction. Electrostatic attraction is only one of several forces responsible for stiction of contacting surfaces. Van der Waals and capillary forces (where moisture is present) are two additional forces that contribute to stiction. As sacrificial layers are etched and rinsed away, any moving structures in a MEM device can become stuck due to surface tension.

Stiction effects have been addressed in MEM accelerometers by modifying the internal structure. For example, on inner surfaces of a MEM device with a folded tether spring, raised tips have been positioned at each inside corner of the device to reduce the surface area of the inside walls that makes contact with the spring. However, contact between any exposed folded portions of a spring or with any extended portions of inner surfaces leave a MEM device functioning as an accelerometer susceptible to stiction.

BRIEF DESCRIPTION OF THE DRAWINGS

The present invention is illustrated by way of example and not limited by the accompanying figures, in which like references indicate similar elements, and in which:

FIG. 1 illustrates a top plan view of a spring portion of a known MEM device susceptible to stiction forces;

FIG. 2 illustrates a top plan view of a MEM structure with a spring portion in accordance with one form of the present invention;

Figure 3:
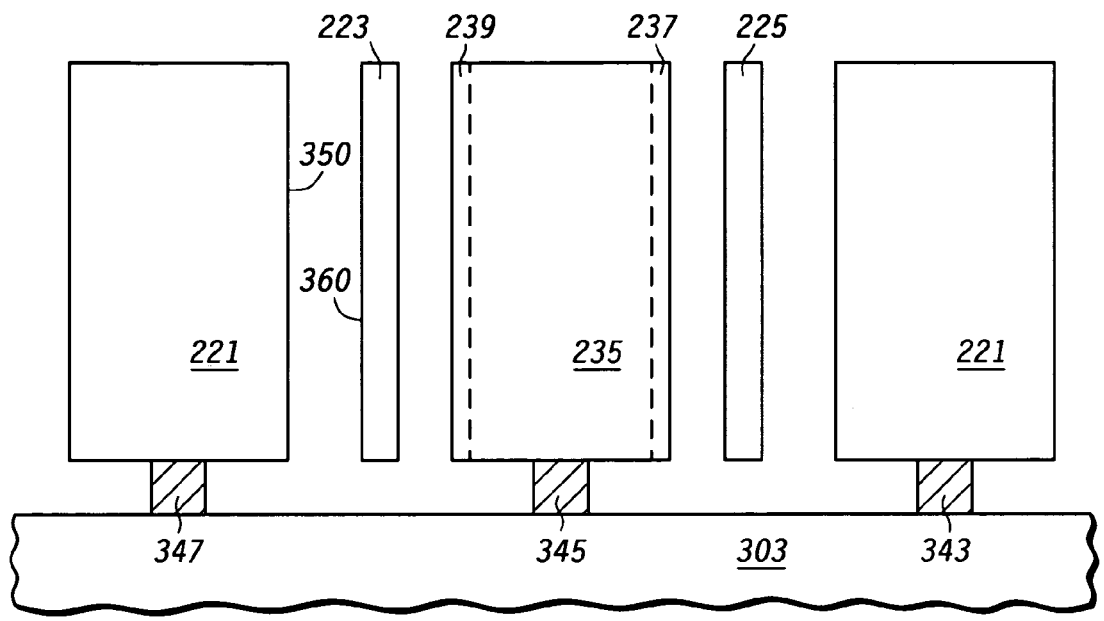
FIG. 3 illustrates a cross-sectional view of the spring portion of the MEM structure of FIG. 2.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Illustrated in FIG. 1 is a top view of a spring portion of a conventional MEM device 101 that functions as a lateral accelerometer. MEM device 101 has a proof mass 105 that is connected to a folded tether spring 122. The folded tether spring 122 is a continuous spring that has various sections such as a spring portion 123 and a spring portion 125. The MEM device 101 also has a spring anchor 107 that is connected to the folded tether spring 122. An immovable structure 121 and an immovable structure 127 are formed around the folded tether spring 122, the spring anchor 107 and a portion of the proof mass 105. The immovable structure 121 and the immovable structure 127 are rigidly connected to an underlying substrate that is not visible in the illustrated view. The rigid connection of immovable structure 121 is made by an anchor 130, and the rigid connection of immovable structure 127 is made by an anchor 128. Each of immovable structure 121 and immovable structure 127 has inside walls or surfaces that may come into contact with the folded tether spring 122. Small extension regions or tips, such as tip 115, are provided at the inside corners of the MEM device 101. An air gap 113 exists between the folded tether spring 122 and the immovable structure 127. Similarly, an air gap 114 exists between the folded tether spring 122 and the immovable structure 121. An air gap 109 also exists between the two portions of the folded tether spring 122 that are folded. A tip 119 is positioned on a lower surface of a portion of the folded tether spring 122 that is laterally opposite the proof mass 105 and is substantially centered with respect to the length of the upper portion of the folded tether spring 122.

In operation, MEM device 101 is an example of a capacitive accelerometer that detects a change in acceleration by the movement in the plane and direction of the bidirectional arrow placed on the proof mass 105 of FIG. 1. As acceleration forces are applied to MEM device 101, the spring anchor 107 does not move but the proof mass 105 will move and thereby cause the folded sections of the folded tether spring 122 to move closer or further from each other. The acceleration acting on proof mass 105 causes a change in capacitance between the moving and fixed components and a relative change in distance between the folded sections of the folded tether spring 122, such as spring portion 123 and spring portion 125. This change in capacitance can be sensed by circuitry (not shown) and the capacitive value change is translated into an acceleration value. When spring portion 125 is caused to touch the spring portion 123, the two surfaces may remain together due to stiction. Once spring portion 125 and spring portion 123 are together, the MEM device 101 will no longer function as intended. An additional source of stiction failure may result should spring portion 123 stick to the inside wall surface of immovable structure 121. Similarly, stiction may also occur when spring portion 125 makes contact with the opposite inside wall surface of immovable structure 121. The tips, such as tip 115 and 119 reduce to an extent the amount of contact that exists between the folded tether spring 122 and the inside surfaces of the immovable structure 127 and immovable structure 121, but there remain extended lengthy portions of the inside wall surface that are in contact with the folded tether spring 122. Therefore, the conventional MEM accelerometer is susceptible to stiction failures between the folds of the spring 122 or to the immovable structure 127.

Illustrated in FIG. 2 is a top plan view of an example of a spring portion of a capacitive accelerometer in the form of MEM accelerometer 201 which is in accordance with one form of the present invention. MEM accelerometer 201 has a laterally movable proof mass 205 that extends into a tether spring 209. The tether spring 209 has a first spring portion 223 and a second spring portion 225 in a folded configuration. The tether spring 209 is anchored or held rigidly in one area by a spring anchor 207. The spring anchor 207 is connected to an underlying substrate (not visible in this view) via a column anchoring structure (not visible in this view). An outer rigid structure 221 is part of the MEM accelerometer 201 that is rigidly fixed to a substrate via anchors such as an anchor 250 and an anchor 252. An inner rigid structure 235 is positioned within the periphery of the tether spring 209. Inner rigid structure 235 is rigidly coupled to a substrate (not shown) via an anchor 254. An outer air gap 208 exists between the movable proof mass 205 and tether spring 209 and the outer rigid structure 221. The outer rigid structure 221 has a plurality of major surfaces, such as a first major surface 213 facing a wall of the tether spring 209. Along and within the first major surface 213 is a plurality of notches, such as notch 231. Along the first major surface 213 is an extension region or a tip 215 that is positioned toward a distal or outside end of the first major surface 213. Each of the plurality of major surfaces of the outer rigid structure 221 has a tip such as tip 215. The inner rigid structure 235 also has a plurality of major surfaces, such as a first major surface 214 facing a wall of the tether spring 209 and an opposite major surface 242. Along each of major surface 240 and major surface 242 is a plurality of notches, such as notch 233. In one form all of the notches are of a same width having a distance or dimension illustrated as "G". Each major surface is separated from a respective wall of the tether spring 209 by a distance illustrated as "D" where generally G is less than or equal to D. At a central area of the first major surface 214 of the inner rigid structure 235 are tips or extension regions such as tip 241. Similar tips (not numbered) are positioned at a central area of the opposite major surface 242 of the inner rigid structure 235. An inner air gap 212 exists between the inner rigid structure 235 and each inner wall of the tether spring 209. Tips may be extended from each of major surface 214 and major surface 242 of the inner rigid structure 235. By way of example only, tips are illustrated along the inner rigid structure 235, such as tip 237 or tip 239. Tips anywhere along these major surfaces, including the distal end areas, may be provided. In one form the tips are epitaxial silicon. Outer surfaces of adjoining notches, whether in the outer rigid structure 221 or the inner rigid structure 235, form a major surface. For example, a major surface 240 exists along one side of inner rigid structure 235 along an axis formed by the outer edges of the notches of the inner rigid structure 235.

In operation, the MEM accelerometer 201 detects a change in acceleration by the movement in the plane and direction of the bidirectional arrow placed on the proof mass 205. MEM accelerometer 201 effectively avoids stiction between the tether spring 209 and the internal surfaces of MEM accelerometer 201. By having the inner rigid structure 235 interposed between the two folded legs or portions of the tether spring 209, the two folded portions of the tether spring 209 will not make contact with each other and will not stick together. The tips of the inner rigid structure 235 such as tip 239 and the analogous tips of the outer rigid structure 221 function to make initial contact with the tether spring 209. The small area of the tip touching the tether spring 209 minimizes stiction during process and operation. If however, the sticking force or acceleration is great enough that the tether spring 209 continues its movement and touches the major wall of one of the inner rigid structure 235 or the outer rigid structure 221, the tips and notches therein further keep surface area contact with the tether spring 209 at a minimum. For example, the notches, such as notch 231 in outer rigid structure 221 and notch 233 in inner rigid structure 235, function to reduce the surface area of each rigid structure that can possibly make contact with the tether spring 209. The notches are an enhancement to using extensions along the major surfaces of the inner rigid structure 235 and outer rigid structure 221. The notches are formed in a conventional manner using a semiconductor etching process. In other words, a mask is used to protect those areas that are desired to remain and a Deep Reactive Ion Etch (DRIE) is performed to etch away material and form the notches. An etchant is used to remove the underlying sacrificial layer. The etchant is then rinsed away and dried. Rinsing solution residue may exist within the MEM accelerometer 201 after the steps of this described process. The notches function to wick away this rinsing solution from the tether spring 209. The tooth-like structure of the notches functions to break apart the meniscus of any rinsing solution by capillary action and pulls residual liquid away from the tether spring 209. The notches function to reduce the amount of surface area along walls of the fixed structure for tether spring 209 to be stuck to. Because the liquid will go between the notches, surface tension between the liquid and the wall surface is reduced. By reducing the area between the wall and the spring for the liquid to stick to, the stiction force between the sides and the spring is lowered, thus reducing stiction due to processing.

Additionally, by placing a rigid structure between each of the two folded portions of the tether spring 209, the restoring force of the tether spring 209 is doubled because the spring has to move twice as far to make contact with a structure as opposed to the structure of FIG. 1. In other words, in FIG. 1, each spring portion moves in response to inertial or surface tension forces. Assume in each of FIG. 1 and FIG. 2 that each spring portion is separated from a closest structural element by the dimension D. Therefore, in FIG. 1 the two spring portions have a separation distance of (D/2) before each spring portion comes into contact with each other. In contrast in FIG. 2, each spring portion is not adjacent to another spring and therefore must move a full separation distance of (D) before the spring will touch a structure. The width or gap, G, of a notch is also illustrated in FIG. 2. Preferably the value G is less than or at most equal to the value D. Therefore, the structure of MEM accelerometer 201 has significantly improved stiction characteristics.

Illustrated in FIG. 3 is a cross section of MEM accelerometer 201 taken substantially along the line 3—3 of FIG. 2. Each of the two illustrated portions of outer rigid structure 221 and the inner rigid structure 235 overlie and are anchored to a substrate 303 via anchors. An anchor 343 connects a first portion of outer rigid structure 221 to substrate 303. In one form the substrate 303 is silicon but other semiconductor materials may be used. An anchor 345 connects inner rigid structure 235 to substrate 303. An anchor 347 connects a second portion of outer rigid structure 221 to substrate 303. It should be noted that all anchors illustrated herein are nonconductive and electrically decouple the MEM device from its substrate. Adjacent the inner rigid structure 235 is first spring portion 223 and second spring portion 225. The inner rigid structure 235 is laterally extended on each side by tips 237 and 239. The outer rigid structure 221 that overlies anchor 347 has a side facing the first spring portion 223 referred to as a major surface 350. Major surface 350 faces a side of the first spring portion 223 referred to as a vertical wall 360. In the illustrated form, the proof mass 205 and the folded tether spring 209 have a high aspect ratio meaning that these two structural elements have a large height relative to the size of the gaps and widths contained therein. The high aspect ratio enables the device to be very sensitive to acceleration, but also can result in a large amount of stiction for a spring design as illustrated in FIG. 1. The improvements provided in the MEM device illustrated by the views of FIGS. 2 and 3 are particularly useful in connection with devices having a high aspect ratio.

Figure 4:
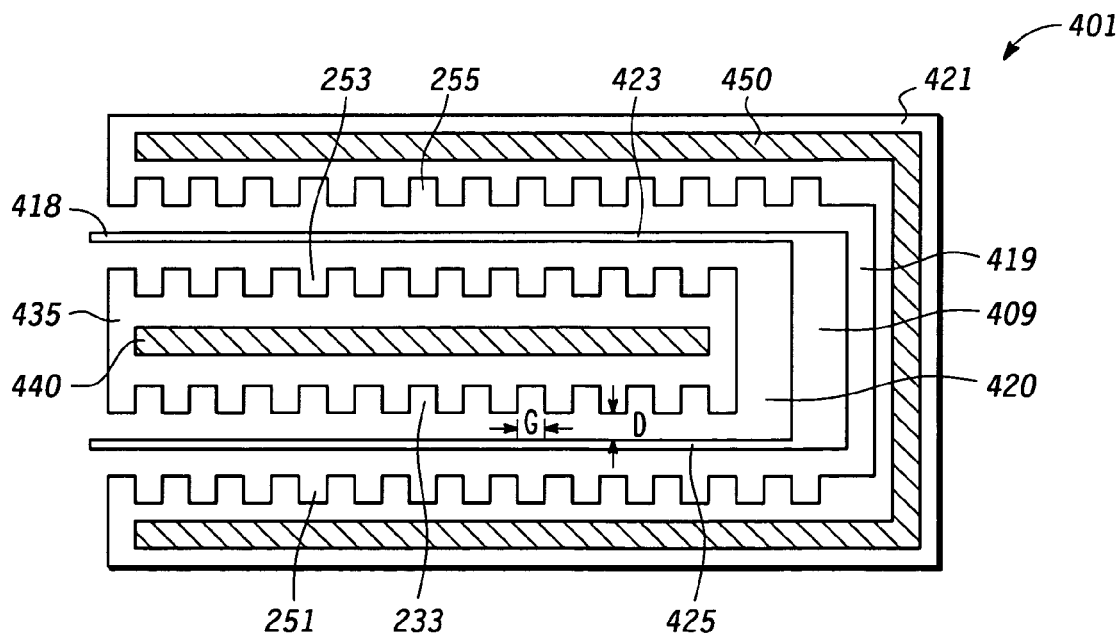
FIG. 4 illustrates a top plan view of a MEM device with a spring portion in accordance with another form of the present invention.

Illustrated in FIG. 4 is a top view of another embodiment of a MEM device. FIG. 4 particularly details a spring portion of a MEM accelerometer 401 in accordance with another form of the present invention. Accelerometer 401 has an outer rigid structure 421 having a plurality of notches such as notch 255 and notch 251. An inner rigid structure 435 also has a plurality of notches such as notch 233 and notch 253. The outer rigid structure 421 has a plurality of notches such as notch 251 and notch 255. A folded tether spring 418 is positioned between the outer rigid structure 421 and the inner rigid structure 435. An air gap 420 separates the inner rigid structure 435 and the folded tether spring 418. An air gap 419 separates the outer rigid structure 421 and the folded tether spring 418. The folded tether spring 418 has a first side spring portion 423, a second side spring portion 425 and an end spring portion 409 that is thicker or wider than the side spring portions. End spring portion 409 is formed wider to reduce cross-axis sensitivity. The outer rigid structure 421 and the inner rigid structure 435 are each anchored to an underlying substrate by an anchor 450 and an anchor 440, respectively.

In operation, the MEM accelerometer 401 uses only notches along the major surfaces of the outer rigid structure 421 and the inner rigid structure 435 as opposed to both notches and tips. The use of the notches in MEM accelerometer 401 significantly reduces the surface area that will touch the folded tether spring 418 when the folded tether spring 418 makes contact with either the inner rigid structure 435 or the outer rigid structure 421. Because tip extensions are not provided at the distal ends of either rigid structure, the notches continue all the way to the end of each rigid structure unlike the structure of MEM accelerometer 201. As with MEM accelerometer 201, the use of the notches wicks away from the folded tether spring 418 rinsing solution that is used during processing to create the illustrated structure. The illustrated structures of MEM accelerometer 401 are made of epitaxial silicon that is etched. In one form of MEM accelerometer 401, a major surface on either side of the inner rigid structure 435 is formed along an axis defined by the outer edge of each portion of inner rigid structure 435 between the notches. This major surface, in one form, is a predetermined distance from the folded tether spring 418 while the folded tether spring 418 is in a zero force position. In this form, each notch has a width that is generally equal to or less than the predetermined distance. In another form, each notch has a width (G) that is generally less than or equal to the distance (D). In another form, each notch has a width that is larger than the predetermined distance by a relatively small amount. In yet another form, some of the notches have a width (G) that is slightly larger than the predetermined distance (D) and a remainder of the notches has a width that is less than the predetermined distance. By having such widths relative to the distance from the wall or side of folded tether spring 418 to the major surface of the inner rigid structure 435, surface area of the major surface is significantly reduced and the meniscus of any liquid drops are readily broken, thus preventing stiction.

There are numerous applications that a MEM structure as described herein may be used in. By way of example only a MEM structure as described herein is used in a vehicle such as a car having a gasoline powered engine. In other embodiments, the vehicle may be one of e.g. a truck, SUV, motorcycle, airplane or other aircraft, an electric or battery powered vehicle or a hybrid powered vehicle. The vehicle includes an accelerometer as taught herein in FIGS. 2–4 attached to the frame of the vehicle. An accelerometer is operably coupled (e.g. by wire or wireless connection) to the controller. In one embodiment, the accelerometer is utilized for security and/or dynamic control of the vehicle such as the control of air bags (not shown) within the vehicle.

Other examples of applications of the MEM structure described herein include cellular phones and other wireless communication devices that use such a MEM structure. A MEM structure as taught herein implemented as an accelerometer may be used to selectively power the cellular phone or wireless communication device or to otherwise place the device in a predetermined mode of operation upon detecting acceleration or failing to detect acceleration.

By now it should be apparent that there has been provided a novel MEM device using a spring. A fixed structure that is rigidly coupled to a substrate is positioned between the folds of a spring suspension in an accelerometer. As a result, the restoring force of the spring is increased and the chances of stiction are reduced. In addition, notches encompass the fixed structure to reduce surface area for a folded tether spring to stick to. Therefore, the use of higher sensitivity springs that readily move across an entire available distance range may be used without increasing stiction failures. Also, the separation distance between the fixed structures and the spring is not compromised by the structures provided herein so that performance is not compromised to obtain reduced stiction. Further reduction of contact area with the folded spring is achieved by the use of extended small lateral stand-offs or tips on both an inner fixed structure and an outer fixed structure. Yield and reliability are therefore increased for MEM structures for use in a variety of applications such as inertial sensors and accelerometers.

In one form there has been provided a micro-electromechanical (MEM) structure. A proof mass is movable with respect to a substrate. A spring anchor is rigidly coupled to the substrate. A tether spring is provided wherein the proof mass is physically coupled to the spring anchor via the tether spring. The tether spring includes a wall. A first structure is rigidly coupled to the substrate, the first structure including a first major surface facing the wall of the tether spring, wherein the first major surface includes a plurality of notches. In one form the tether spring includes a first portion and a second portion in a folded configuration. The first structure includes at least a portion located between the first portion and the second portion. In another form the first wall is located on the first portion. In another form the second portion includes a second wall. The first structure includes a second major surface, the second major surface including a second plurality of notches, the second major surface facing the second wall. The first portion further includes a third wall located on the first portion, the third wall being on an opposite side of the wall that faces the first structure. The MEM structure further includes a third major surface of a structure rigidly coupled to the substrate, the third major surface facing the third wall, the third major surface including a third plurality of notches. The second portion includes a fourth wall on an opposite side of the second portion from the second wall. The MEM structure further includes a fourth major surface of a structure rigidly coupled to the substrate. The fourth major surface faces the fourth wall, the fourth major surface including a fourth plurality of notches. The first major surface and the second major surface are generally parallel to each other. The wall is located on a lateral side of a portion of the tether spring. The portion of the tether spring includes a second wall on an opposite side of the portion of the wall. The MEM structure further includes a second major surface of a structure rigidly coupled to the substrate, the second major surface facing the second wall, the second major surface including a second plurality of notches. In one form the proof mass, the tether spring, and the first structure are each made of a first material that includes epitaxial silicon. The plurality of notches is located in a first direction along the first major surface spaced apart at generally a first interval. The first major surface extends in the first direction a first distance (G), wherein the plurality of notches occupies at least a majority of the first distance of the first major surface. Each notch of the plurality of notches is spaced along the first major surface and separated by at least a first distance from an adjacent notch of the plurality, wherein each of the plurality of notches has a width in the first direction that is equal to or less than the first distance. The first major surface is located at a first distance (D) from the wall while the spring is in a zero force, wherein each notch of the plurality has a width generally equal to or less than the first distance. The first structure includes an extension extending from the first major surface towards the wall. The tether spring includes a first portion and a second portion in a folded configuration. The tether spring also includes a folded end portion connecting the first portion and the second portion at a distal end of the spring. The extension is located in relative proximity to the distal end. Each of the notches of the plurality of notches has a depth from the first major surface. The extension extends out to a second distance from the first major surface. The second distance is less than the depth of each notch of the plurality of notches. In one form each notch of the plurality has a width generally equal to or less than two microns. In one form the MEM structure is implemented in an accelerometer. In another form the MEM structure is used in a motorized vehicle wherein the motorized vehicle further includes a controller and the MEM structure is operably coupled to the controller. In another form the proof mass and spring are characterized as having a high aspect ratio.

In yet another form there is provided a micro-electromechanical (MEM) structure that has a proof mass movable with respect to a substrate. A spring anchor is rigidly coupled to the substrate. A tether spring includes a first portion and a second portion in a folded configuration. The proof mass is physically coupled to the spring anchor via the tether spring. A first structure is rigidly coupled to the substrate. The first structure includes at least a portion located between the first portion and the second portion. The first structure includes a first major surface facing a first wall of the first portion. The first structure includes a second major surface facing a second wall of the second portion. The first major surface includes a first plurality of notches and the second major surface includes a second plurality of notches. The first structure includes a first extension extending from the first major surface towards the first wall of the first portion. The first structure includes a second extension extending from the second major surface towards the second wall of the second portion. The first major surface is located at a first distance from the wall while the spring is in a zero force, wherein each notch of the first plurality of notches has a width substantially equal to or less than the first distance. The second major surface is located at a second distance from the second wall while the spring is in a zero force, wherein each notch of the second plurality of notches has a width substantially equal to or less than the second distance. In one form each notch of the first plurality of notches is spaced along the first wall and separated by at least a first distance from an adjacent notch of the first plurality. Each notch of the first plurality of notches has a lateral width that is equal to or less than the first distance.

In another form there is provided a micro-electromechanical (MEM) structure having a proof mass located above a substrate and movable with respect to the substrate. A spring anchor is located above the substrate and is rigidly coupled to the substrate. A tether spring is integrally formed with the proof mass, the proof mass physically coupled to the spring anchor via the tether spring. The tether spring includes an elongated portion having a vertical wall. A first structure is rigidly coupled to the substrate. The first structure includes a first major vertical surface facing the vertical wall of the tether spring. The first major surface includes a plurality of vertically oriented notches, each notch of the plurality of vertically oriented notches being laterally spaced along the wall and separated by at least a first distance from an adjacent notch of the plurality of vertically oriented notches. Each notch of the plurality of vertically oriented notches has a lateral width that is equal to or less than the first distance. In one form the vertical wall is laterally located a second distance from the first major vertical surface when the tether spring is in a zero force. The lateral width of each notch of the plurality of vertical oriented notches is less than the second distance. The first structure includes a first extension laterally extending from the first major vertical surface towards the vertical wall.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A micro-electromechanical (MEM) structure comprising:
   a proof mass movable with respect to a substrate;
   a spring anchor rigidly coupled to the substrate;
   a tether spring comprising a first portion and a second portion in a folded configuration, the proof mass physically coupled to the spring anchor via the tether spring, wherein the tether spring includes a wall with a height; and
   a first structure rigidly coupled to the substrate and comprising at least a portion located between the first portion and second portion of the tether spring, the first structure including a first major surface facing the wall of the tether spring, wherein the first major surface includes a plurality of notches.

2. The MEM structure of claim 1 wherein:
   the wall is located on the first portion;
   the second portion includes a second wall, and the first structure includes a second major surface, the second major surface including a second plurality of notches, the second major surface facing the second wall, each notch of the first plurality of notches being substantially aligned with a corresponding notch of the second plurality of notches.

3. The MEM structure of claim 2 wherein:
the first portion further includes a third wall located on the first portion, the third wall being on an opposite side of the wall that faces the first structure; and
the MEM structure further includes a third major surface of a structure rigidly coupled to the substrate, the third major surface facing the third wall, the third major surface including a third plurality of notches.

4. The MEM structure of claim 3 wherein:
the second portion includes a fourth wall on an opposite side of the second portion from the second wall; and
the MEM structure further includes a fourth major surface of a structure rigidly coupled to the substrate, the fourth major surface facing the fourth wall, the fourth major surface including a fourth plurality of notches.

5. The MEM structure of claim 2 wherein the first major surface and the second major surface are generally parallel to each other.

6. The MEM structure of claim 1 wherein:
the wall is located on a side of a portion of the tether spring;
the portion of the tether spring includes a second wall on an opposite side of the wall; and
the MEM structure further includes a second major surface of a structure rigidly coupled to the substrate, the second major surface facing the second wall, the second major surface including a second plurality of notches.

7. The MEM structure of claim 1 wherein the proof mass, the tether spring, and the first structure are each made of a first material.

8. The MEM structure of claim 7 wherein the first material includes epitaxial silicon.

9. The MEM structure of claim 1 wherein the plurality of notches are located in a first direction along the first major surface spaced apart at generally a first interval.

10. The MEM structure of claim 9 wherein the first major surface extends in the first direction a first distance, wherein the plurality of notches occupy at least a majority of the first distance of the first major surface.

11. The MEM structure of claim 1 wherein each notch of the plurality of notches is spaced along the first major surface in a first direction and separated by at least a first distance from an adjacent notch of the plurality of notches, wherein each of the plurality of notches has a width in the first direction that is equal to or less than the first distance.

12. The MEM structure of claim 1 wherein the first major surface is located at a first distance from the wall while the tether spring is in a zero force position, wherein each notch of the plurality of notches has a width generally equal to or less than the first distance.

13. The MEM structure of claim 1 wherein the first structure includes an extension extending from the first major surface towards the wall.

14. The MEM structure of claim 13 wherein:
the tether spring includes a first portion and a second portion in a folded configuration, the tether spring also includes a folded end portion connecting the first portion and the second portion at a distal end of the tether spring; and
the extension is located in relative proximity to the distal end.

15. The MEM structure of claim 13 wherein:
each notch of the plurality of notches has a depth from the first major surface;
the extension extends out to a second distance from the first major surface; and
the second distance is less than the depth of each notch of the plurality of notches.

16. The MEM structure of claim 1 wherein each notch of the plurality of notches has a width generally equal to or less than two microns.

17. The MEM structure of claim 1 wherein the first structure is rigidly coupled to the substrate by an anchor centrally positioned within the first structure and which extends substantially a length of the first structure.

18. The MEM structure of claim 1 wherein the tether spring is characterized as having a large height relative to size of gaps between the tether spring and the first structure.

19. A micro-electromechanical (MEM) structure comprising:
a proof mass movable with respect to a substrate;
a spring anchor rigidly coupled to the substrate;
a tether spring, the proof mass physically coupled to the spring anchor via the tether spring, wherein the tether spring includes a first portion and a second portion in a folded configuration; and
a first structure rigidly coupled to the substrate, the first structure includes at least a portion located between the first portion and the second portion, the first structure including a first major surface facing a first wall of the first portion, the first structure including a second major surface facing a second wall of the second portion, the first major surface comprises a first plurality of notches, the second major surface comprises a second plurality of notches.

20. The MEM structure of claim 19 wherein:
the first structure comprises a first extension extending from the first major surface towards the first wall of the first portion; and
the first structure comprises a second extension extending from the second major surface towards the second wall of the second portion.

21. The MEM structure of claim 19 wherein:
the first major surface is located at a first distance from the first wall while the spring is in a zero force position, wherein each notch of the first plurality of notches has a width substantially equal to or less than the first distance; and
the second major surface is located at a second distance from the second wall while the tether spring is in a zero force position, wherein each notch of the second plurality of notches has a width substantially equal to or less than the second distance.

22. The MEM structure of claim 19 wherein:
each notch of the first plurality of notches is spaced along the first wall and separated by at least a first distance from an adjacent notch of the first plurality of notches, and each notch of the first plurality of notches has a lateral width that is equal to or less than the first distance.

23. A micro-electromechanical (MEM) structure comprising:
a proof mass located above a substrate and movable with respect to the substrate;
a spring anchor located above the substrate and rigidly coupled to the substrate;

a tether spring integrally formed with the proof mass, the proof mass physically coupled to the spring anchor via the tether spring, the tether spring comprising an elongated portion having a vertical wall; and a first structure rigidly coupled to the substrate, the first structure including a first major vertical surface facing the vertical wall of the tether spring, wherein the first major vertical surface includes a plurality of vertically oriented notches, each notch of the plurality of vertically oriented notches is laterally spaced along the vertical wall and separated by at least a first distance from an adjacent notch of the plurality of vertically oriented notches, wherein each notch of the plurality of vertically oriented notches has a lateral width that is equal to or less than the first distance, the first structure including a first extension laterally extending from the first major vertical surface towards the vertical wall.

24. The MEM structure of claim 23 wherein:

the vertical wall is laterally located a second distance from the first major vertical surface when the tether spring is in a zero force position; and wherein the lateral width of each notch of the plurality of vertical oriented notches is less than the second distance.

\* \* \* \* \*